US010324657B2

(12) United States Patent
Leggette et al.

(10) Patent No.: US 10,324,657 B2
(45) Date of Patent: Jun. 18, 2019

(54) ACCOUNTING FOR DATA WHOSE REBUILDING IS DEFERRED

(71) Applicant: International Business Machines Corporation, Armonk, NY (US)

(72) Inventors: Wesley B. Leggette, Chicago, IL (US); Jason K. Resch, Chicago, IL (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 234 days.

(21) Appl. No.: 15/353,486

(22) Filed: Nov. 16, 2016

(65) Prior Publication Data
US 2017/0060481 A1 Mar. 2, 2017

Related U.S. Application Data

(63) Continuation-in-part of application No. 15/082,887, filed on Mar. 28, 2016.
(Continued)

(51) Int. Cl.
*G06F 3/06* (2006.01)
*G06F 11/10* (2006.01)
*H03M 13/15* (2006.01)

(52) U.S. Cl.
CPC .......... *G06F 3/0659* (2013.01); *G06F 3/0604* (2013.01); *G06F 3/067* (2013.01);
(Continued)

(58) Field of Classification Search
CPC .... G06F 3/0659; G06F 3/0604; G06F 3/0608; G06F 3/0619; G06F 3/0622;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Thanh-Ha Dang
(74) *Attorney, Agent, or Firm* — Garlick & Markison; Timothy W. Markison; Randy W. Lacasse

(57) ABSTRACT

Systems and methods for accounting for data whose rebuilding is deferred in a dispersed storage network. The methods include determining a number of compromised slices associated with a dispersed storage unit. The number of existing slices associated with the dispersed storage unit is also determined. A comparison of the number of compromised slices plus the number of existing slices associated with the dispersed storage unit, to a storage capacity, is performed in order to produce a capacity determination. Write requests directed towards the dispersed storage unit may be failed based on the capacity determination. For example, the DS unit may fail write requests, when a write request would cause the dispersed storage unit to exceed the storage capacity of the dispersed storage unit when taking into consideration existing slices as well as compromised slices that need to be rebuilt.

20 Claims, 7 Drawing Sheets

Related U.S. Application Data

(60) Provisional application No. 62/168,145, filed on May 29, 2015.

(52) U.S. Cl.
CPC .......... *G06F 3/0608* (2013.01); *G06F 3/0619* (2013.01); *G06F 3/0622* (2013.01); *G06F 3/0629* (2013.01); *G06F 3/0644* (2013.01); *G06F 3/0653* (2013.01); *G06F 11/1076* (2013.01); *H03M 13/1515* (2013.01)

(58) Field of Classification Search
CPC .... G06F 3/0629; G06F 3/0644; G06F 3/0653; G06F 3/067; G06F 11/1076; H03M 13/1515
USPC ........................................................ 707/827
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2008/0183975 | A1* | 7/2008 | Foster ................. G06F 11/1076 711/153 |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2010/0306578 | A1* | 12/2010 | Thornton ............ G06F 11/1076 714/6.12 |
| 2012/0198066 | A1* | 8/2012 | Grube ................. H04L 67/1097 709/225 |
| 2013/0326264 | A1* | 12/2013 | Resch ................. G06F 11/1088 714/6.2 |
| 2013/0346716 | A1* | 12/2013 | Resch ................... G06F 3/0619 711/162 |
| 2014/0195875 | A1* | 7/2014 | Resch ................. G06F 11/1092 714/763 |
| 2014/0245063 | A1* | 8/2014 | Baptist ............... G06F 11/2094 714/6.22 |
| 2015/0039660 | A1* | 2/2015 | Baptist ................... G06F 3/067 707/827 |
| 2015/0154074 | A1* | 6/2015 | Resch ................. G06F 11/1088 714/764 |
| 2015/0193309 | A1* | 7/2015 | Khadiwala .......... G06F 11/1435 714/4.11 |
| 2015/0317196 | A1* | 11/2015 | Kazi ..................... H04L 9/3242 714/47.2 |
| 2016/0088084 | A1* | 3/2016 | Suman ............... H04L 67/1097 709/201 |
| 2016/0224422 | A1* | 8/2016 | Resch ................. G06F 11/1076 |
| 2016/0350329 | A1* | 12/2016 | Resch ................... G06F 3/0622 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

(56) References Cited

OTHER PUBLICATIONS

Zeilenga; Lightweight Directory Access Protocol (LDAP): Directory Information Models; IETF Network Working Group; RFC 4512; Jun. 2006; pp. 1-49.
Sciberras; Lightweight Directory Access Protocol (LDAP): Schema for User Applications; IETF Network Working Group; RFC 4519; Jun. 2006; pp. 1-33.
Harrison; Lightweight Directory Access Protocol (LDAP): Authentication Methods and Security Mechanisms; IETF Network Working Group; RFC 4513; Jun. 2006; pp. 1-32
Zeilenga; Lightweight Directory Access Protocol (LDAP): Technical Specification Road Map; IETF Network Working Group RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

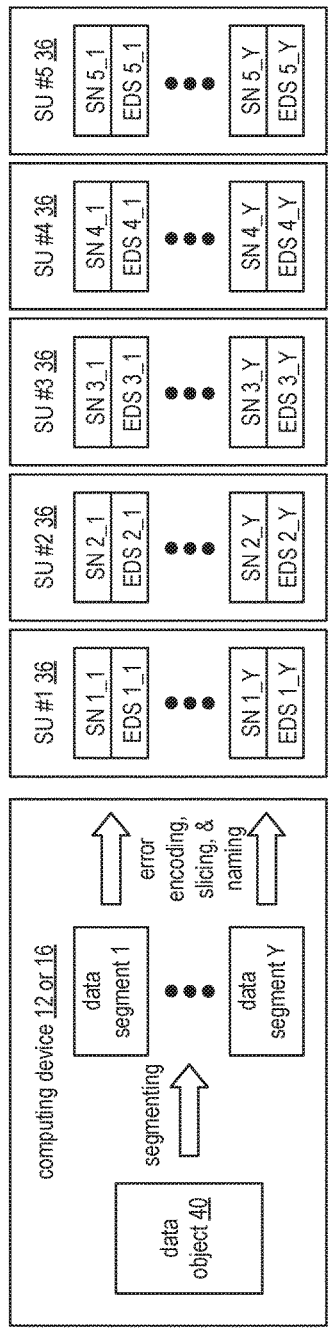
FIG. 3
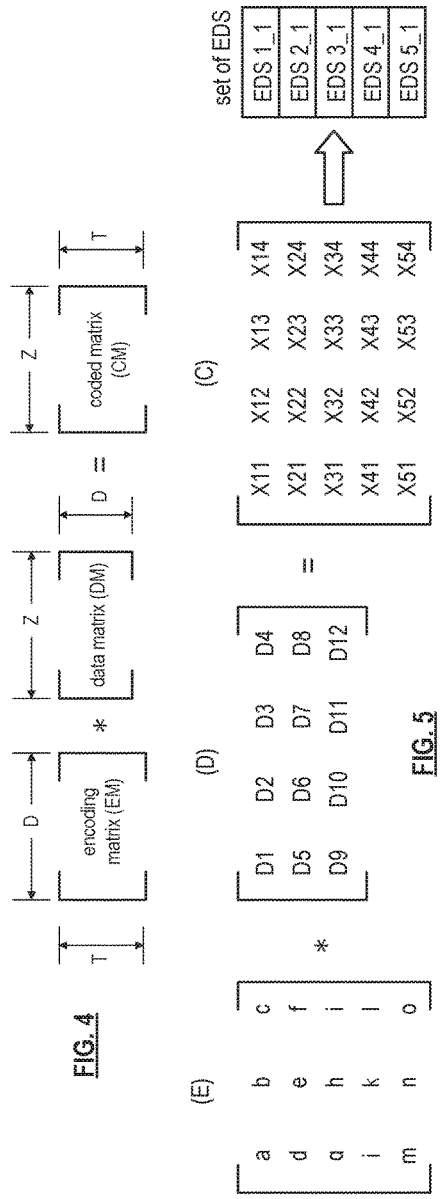
FIG. 4
FIG. 5
FIG. 6

ACCOUNTING FOR DATA WHOSE REBUILDING IS DEFERRED

CROSS REFERENCE TO RELATED APPLICATIONS

The present U.S. Utility Patent Application claims priority pursuant to 35 U. S.C. § 120 as a continuation-in-part of U.S. Utility application Ser. No. 15/082,887, entitled "TRANSFERRING ENCODED DATA SLICES IN A DISPERSED STORAGE NETWORK", filed Mar. 28, 2016, which claims priority pursuant to 35 U.S.C. § 119(e) to U.S. Provisional Application No. 62/168,145, entitled "TRANSFERRING ENCODED DATA SLICES BETWEEN STORAGE RESOURCES", filed May 29, 2015, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks, and more particularly to dispersed or cloud storage.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote or Internet storage system. The remote or Internet storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE SEVERAL VIEWS OF THE DRAWING(S)

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of slice naming information for an encoded data slice (EDS) in accordance with the present disclosure;

DETAILED DESCRIPTION OF THE INVENTION

Figure 1:
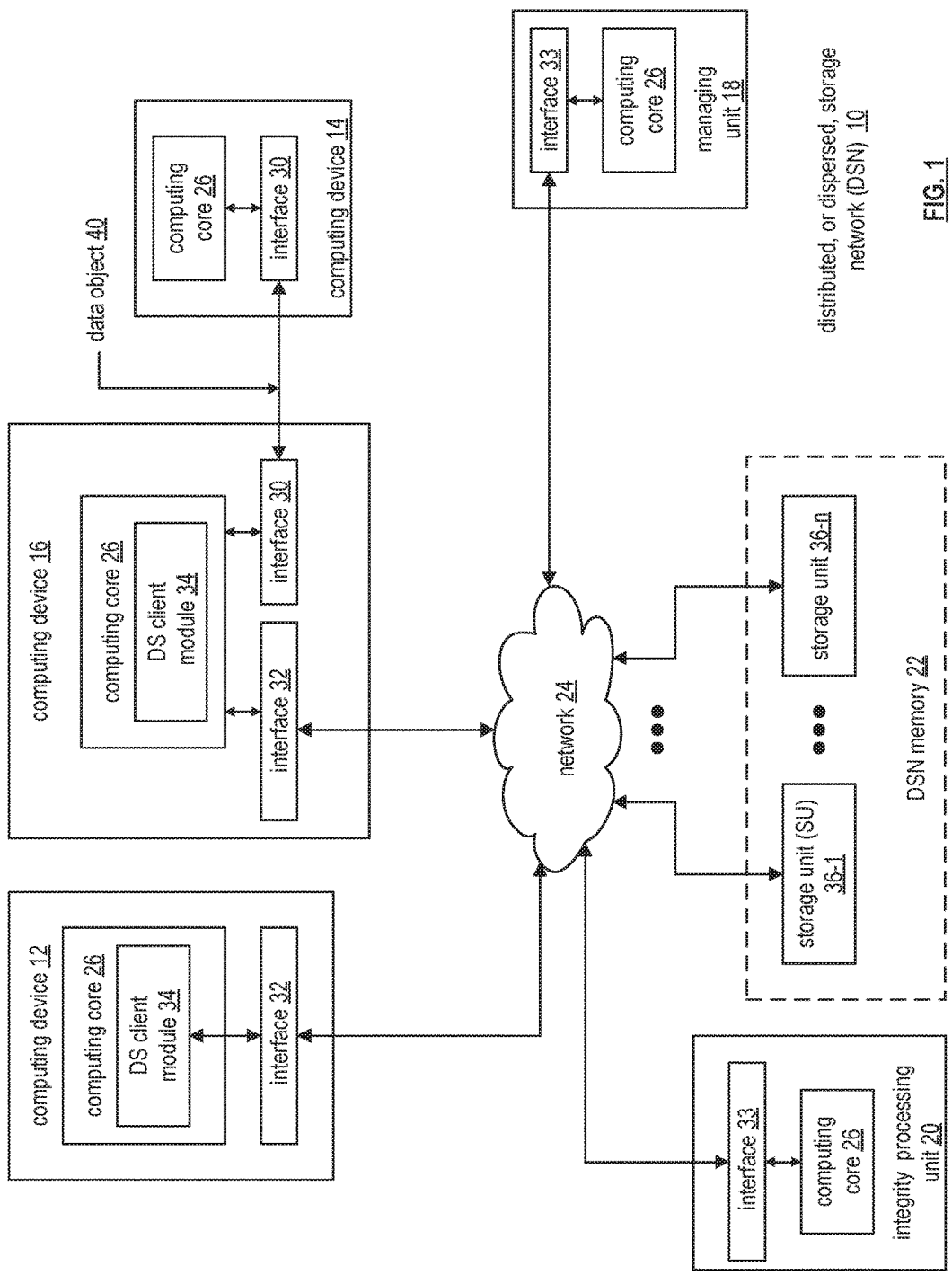
FIG. 1 is a schematic block diagram of an embodiment of a dispersed, or distributed, storage network (DSN) in accordance with the present disclosure.

FIG. 1 is a schematic block diagram of an embodiment of a dispersed, or distributed, storage network (DSN) 10 that includes a plurality of dispersed storage (DS) computing devices or processing units 12-16, a DS managing unit 18, a DS integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

The DSN memory 22 includes a plurality of dispersed storage units 36 (DS units) that may be located at geographically different sites (e.g., one in Chicago, one in Milwaukee, etc.), at a common site, or a combination thereof. For example, if the DSN memory 22 includes eight dispersed storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36.

DS computing devices 12-16, the managing unit 18, and the integrity processing unit 20 include a computing core 26, and network or communications interfaces 30-33 which can be part of or external to computing core 26. DS computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the dispersed storage units 36.

Each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

In general and with respect to DS error encoded data storage and retrieval, the DSN 10 supports three primary operations: storage management, data storage and retrieval. More specifically computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing or hacking the data).

The second primary function (i.e., distributed data storage and retrieval) begins and ends with a DS computing devices 12-14. For instance, if a second type of computing device 14 has data 40 to store in the DSN memory 22, it sends the data 40 to the DS computing device 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.).

In operation, the managing unit 18 performs DS management services. For example, the managing unit 18 establishes distributed data storage parameters (e.g., vault creation, distributed storage parameters, security parameters, billing information, user profile information, etc.) for computing devices 12-16 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network operations can further include monitoring read, write and/or delete communications attempts, which attempts could be in the form of requests. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

To support data storage integrity verification within the DSN 10, the integrity processing unit 20 (and/or other devices in the DSN 10 such as managing unit 18) may assess and perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are assessed and checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, managing unit 18, stored on a DS unit 36, and/or distributed among multiple storage units 36.

Figure 2:
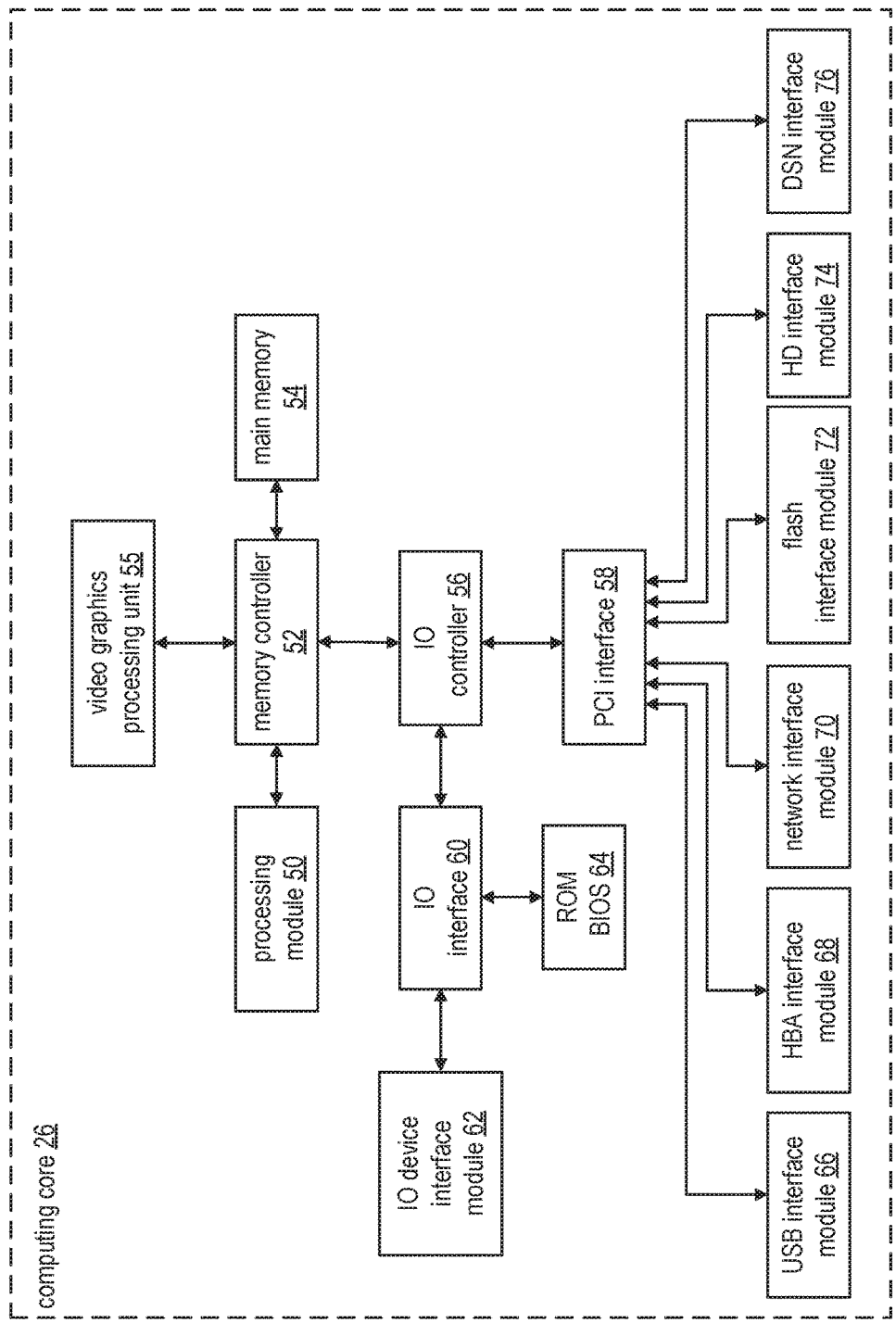
FIG. 2 is a schematic block diagram of an embodiment of a computing core in accordance with the present disclosure.

FIG. 2 is a schematic block diagram of an embodiment of a computing core 26 that includes a processing module 50, a memory controller 52, main memory 54, a video graphics processing unit 55, an input/output (10) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value X11=aD1+bD5+cD9, X12=aD2+bD6+cD10, . . . X53=mD3+nD7+oD11, and X54=mD4+nD8+oD12.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
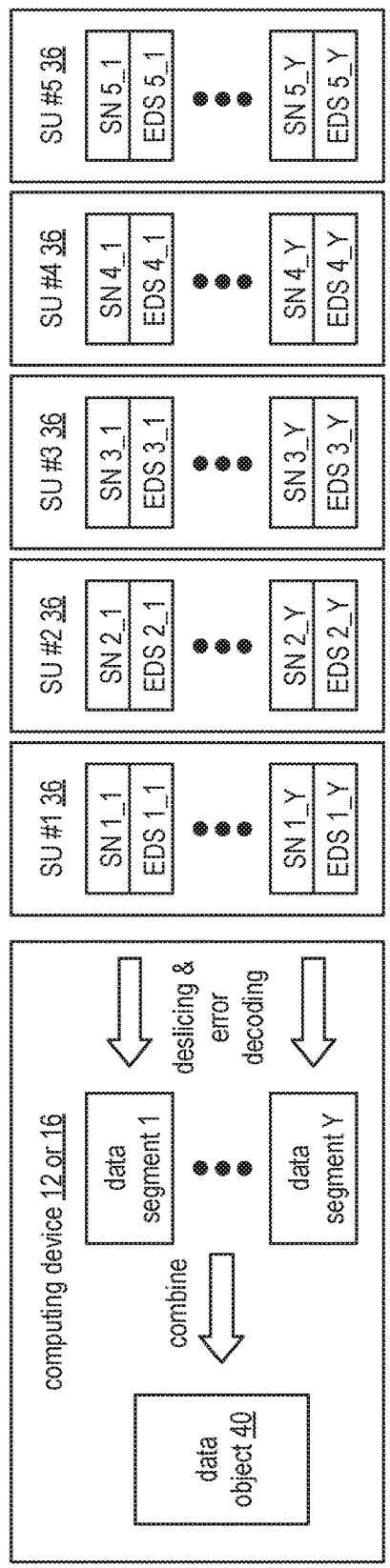
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
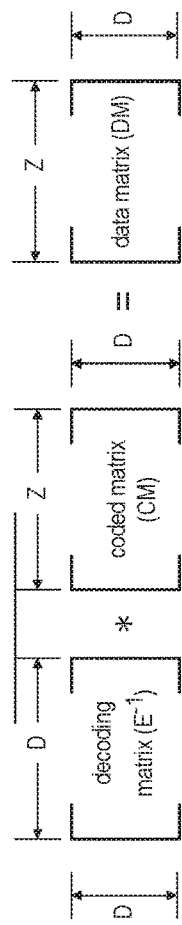
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
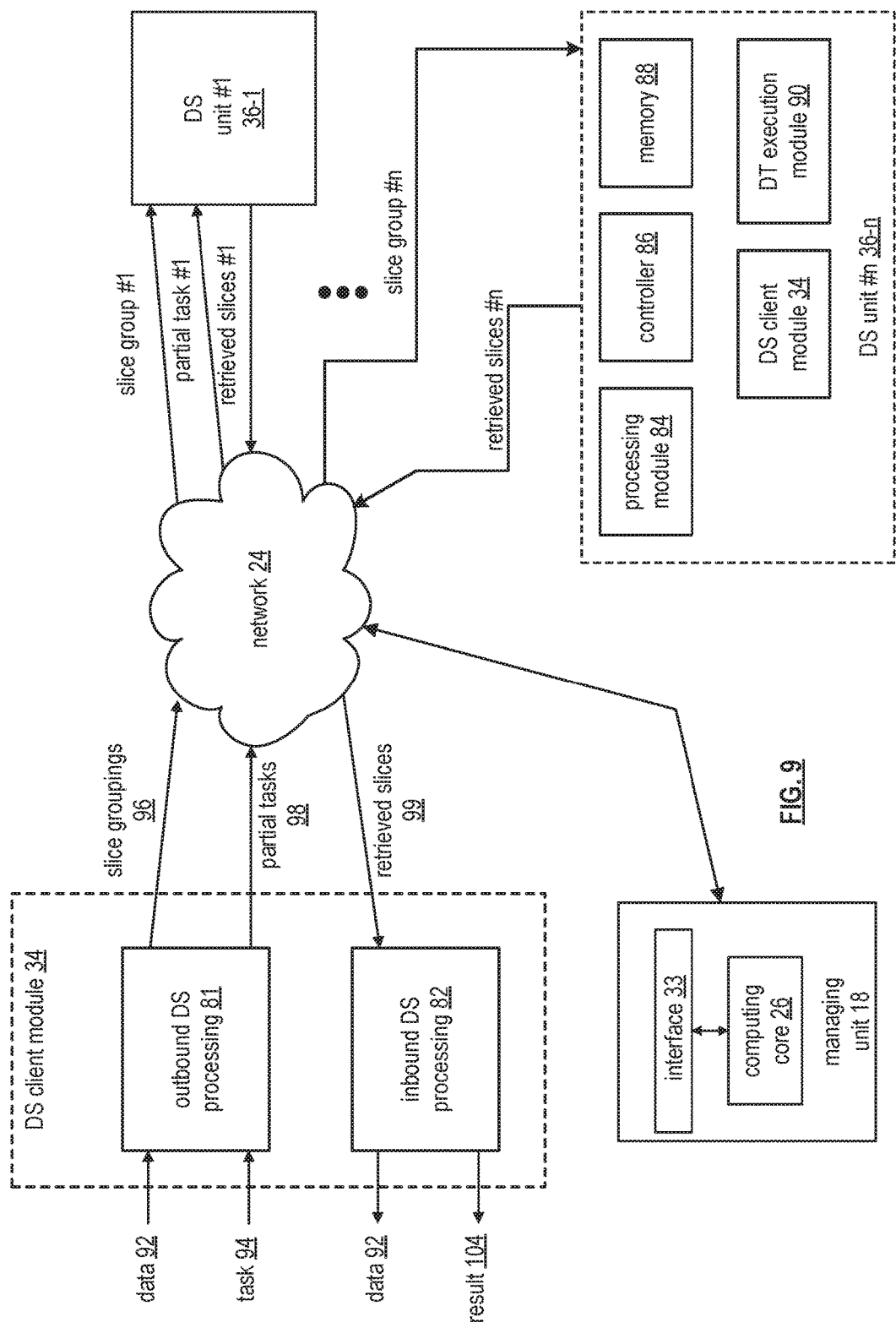
FIG. 9 is a schematic block diagram of an example of a dispersed storage network in accordance with the present disclosure.

FIG. 9 is a diagram of an example of a dispersed storage network. The dispersed storage network includes a DS (dispersed storage) client module 34 (which may be in DS computing devices 12 and/or 16 of FIG. 1), a network 24, and a plurality of DS units 36-1 . . . 36-n (which may be storage units 36 of FIG. 1 and which form at least a portion of DS memory 22 of FIG. 1), a DSN managing unit 18, and a DS integrity verification module (not shown). The DS client module 34 includes an outbound DS processing section 81 and an inbound DS processing section 82. Each of the DS units 36-1 . . . 36-n includes a controller 86, a processing module 84 (e.g. computer processor) including a communications interface for communicating over network 24 (not shown), memory 88, a DT (distributed task) execution module 90, and a DS client module 34.

In an example of operation, the DS client module 34 receives data 92. The data 92 may be of any size and of any content, where, due to the size (e.g., greater than a few Terabytes), the content (e.g., secure data, etc.), and/or concerns over security and loss of data, distributed storage of the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DS client module 34, the outbound DS processing section 81 receives the data 92. The outbound DS processing section 81 processes the data 92 to produce slice groupings 96. As an example of such processing, the outbound DS processing section 81 partitions the data 92 into a plurality of data partitions. For each data partition, the outbound DS processing section 81 dispersed storage (DS) error encodes the data partition to produce encoded data slices and groups the encoded data slices into a slice grouping 96.

The outbound DS processing section 81 then sends, via the network 24, the slice groupings 96 to the DS units 36-1 . . . 36-n of the DSN memory 22 of FIG. 1. For example, the outbound DS processing section 81 sends slice group 1 to DS storage unit 36-1. As another example, the outbound DS processing section 81 sends slice group #n to DS unit #n.

In one example of operation, the DS client module 34 requests retrieval of stored data within the memory of the DS units 36. In this example, the task 94 is retrieve data stored in the DSN memory 22. Accordingly, and according to one embodiment, the outbound DS processing section 81 converts the task 94 into a plurality of partial tasks 98 and sends the partial tasks 98 to the respective DS storage units 36-1 . . . 36-n.

In response to the partial task 98 of retrieving stored data, a DS storage unit 36 identifies the corresponding encoded data slices 99 and retrieves them. For example, DS unit #1 receives partial task #1 and retrieves, in response thereto, retrieved slices #1. The DS units 36 send their respective retrieved slices 99 to the inbound DS processing section 82 via the network 24.

The inbound DS processing section 82 converts the retrieved slices 99 into data 92. For example, the inbound DS processing section 82 de-groups the retrieved slices 99 to produce encoded slices per data partition. The inbound DS processing section 82 then DS error decodes the encoded slices per data partition to produce data partitions. The inbound DS processing section 82 de-partitions the data partitions to recapture the data 92.

In one example of operation, the DSN of FIGS. 1 and 9 is used account for data whose rebuilding is deferred. Explanations of this process are set out below in conjunction with FIGS. 10A and 10B. While described in the context of functionality provided by DS units 36-1 . . . 36-n and DS processing unit 16, this function may be implemented utilizing any module and/or unit of a dispersed storage network (DSN) including the DS Managing Unit 18 and the Integrity Processing Unit 20 shown in FIG. 1.

According to one example, each DS unit may be associated with at least one pillar of N pillars associated with an information dispersal algorithm (IDA), where a data segment is dispersed storage error encoded using the IDA to produce one or more sets of encoded data slices, and where each set includes N encoded data slices and like encoded data slices (e.g., slice 3's) of two or more sets of encoded data slices are included in a common pillar (e.g., pillar 3). Each site may not include every pillar and a given pillar may be implemented at more than one site.

For example, during operation, having received a data segment, the DS unit dispersed storage error encodes the data segment in accordance with dispersal parameters to produce a set of encoded data slices 1-n. The dispersal parameters include an information dispersal algorithm (IDA) width=n and a decode threshold k, where the decode threshold number of encoded data slices of the set of encoded data slices is required to reproduce the data segment.

When deferred rebuilding is applied in a dispersed storage network system, the average utilization will generally tend toward somewhere in the middle of (Width/IDA Threshold) and (Rebuild Threshold/IDA Threshold). For example, in a 10-of-16 system with a rebuild threshold of 14, there will be a roughly equal proportion of sources that have 14 slices, 15 slices, and 16 slices, with a usually negligible amount of data below 14 slices. Therefore, the average perceived expansion factor of the system is closer to (15/10) rather than (16/10) or (14/10). This excess in capacity, due to the large number of slices that are compromised (i.e. bad or missing) in the system, can lead to accounting problems if not carefully managed. For example, one might "over fill" their storage and then later rebuilding attempts may fail due to lack of capacity, or vault quotas might be exceeded by rebuilding or changing of the rebuild threshold in the future. To prevent these situations, the amount of compromised slices is determined and may be reported by each DS units, for receipt by a dispersed storage processing unit, such that the dispersed storage processing unit can use the report for purposes of quota enforcement, storage location selection, allotment enforcement, capacity planning, and other related purposes. When the number of existing slices on a DS unit plus the number of slices that need to be rebuilt (i.e. compromised: bad or missing) exceeds the storage capacity of the DS unit, then the DS unit may fail any write requests. Similarly, if the number of existing slices and the number of slices that need to be rebuilt do not exceed the storage capacity of the DS unit the DS unit may fail any write requests that would cause the DS unit to it to exceed its storage capacity.

Figure 10A:
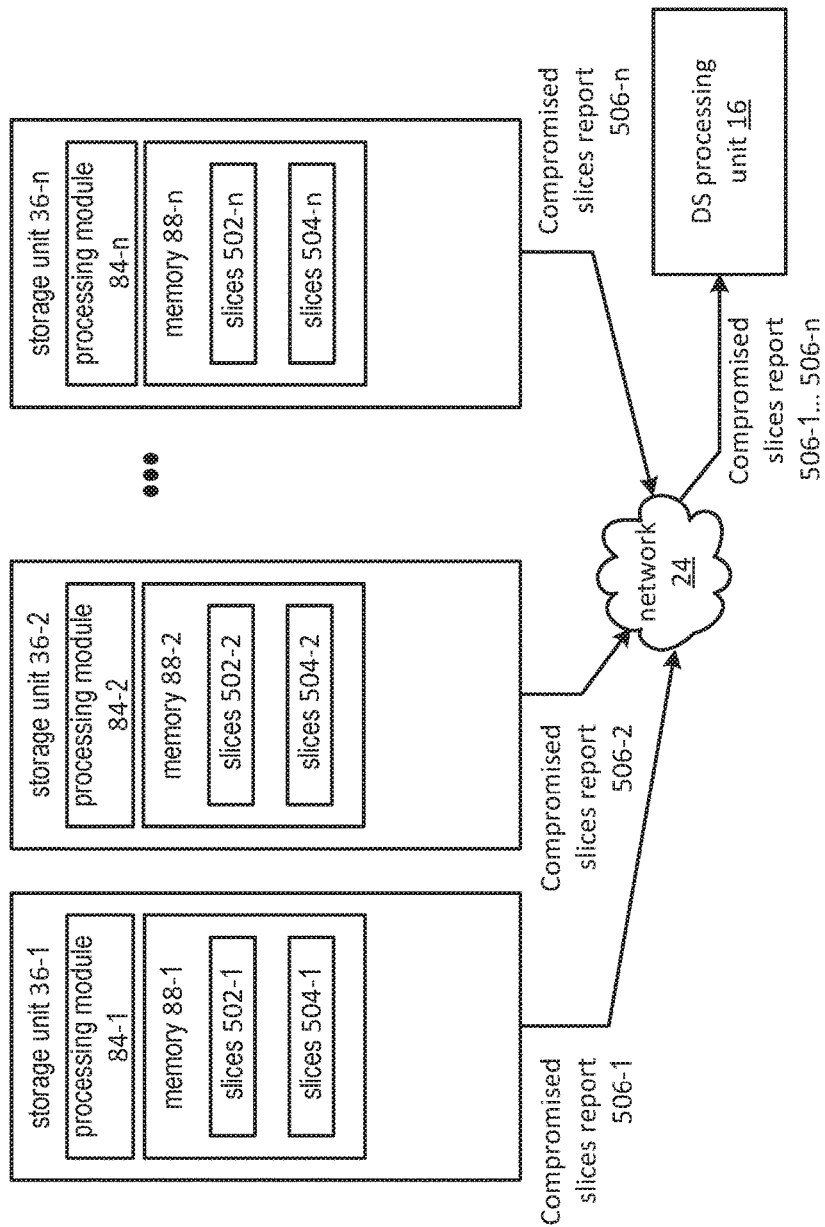
FIG. 10A is a schematic block diagram of another embodiment of a dispersed storage network (DSN) in accordance with the present invention.

FIG. 10A is a schematic block diagram of another embodiment of a dispersed storage network (DSN) that includes a set of storage units 36-1 to 36-*n*, the network 24 of FIG. 1, and the distributed storage (DS) processing unit 16 of FIG. 1. Each storage unit includes a respective processing module 84-1 to 84-*n* and at least one respective memory 88-1 to 88-*n*. The processing module may be implemented utilizing the processing module 84 of FIG. 9 and the memory may be implemented utilizing the memory 88 of FIG. 9. The storage unit may be implemented utilizing the DS execution unit 36 of FIG. 1. The DSN functions to account for data whose rebuilding is deferred.

As an example of accounting for data whose rebuilding is deferred generating the storage structure, the DS units 36-1, 36-2 . . . 36-*n* have existing dispersed storage error encoded data slices 502-1, 502-2 . . . 502-*n* and compromised (e.g. bad or missing) dispersed storage error encoded data slices 504-1, 504-2 . . . 504-*n* associated therewith. According to one example, the DS units 36-1, 36-2 . . . 36-*n* determine the respective number of compromised dispersed storage error encoded data slices and the respective number of existing slices associated with their respective memory 88-1, 88-2 . . . 88-*n*. The respective processing modules 84-1, 84-2 . . . 84-*n* of DS units 36-1, 36-2 . . . 36-*n* then determine whether the respective number of compromised slices plus existing slices exceeds a respective storage capacity in order to produce a capacity determination. Based on the capacity determinations a respective DS unit will then fail write requests that would cause the DS unit to exceed its respective storage capacity when taking into account the respective existing and compromised slices associated therewith. The DS units 36-1, 36-2 . . . 36-*n* may also send respective compromised slice reports 506-1, 506-2 . . . 506-*n* including, but not limited to, an indication of the respective number of compromised slices 504-1, 504-2. . . 504-*n* associated with the respective DS unit. DS processing unit 16 can then use the reports for purposes of quota enforcement, storage location selection, allotment enforcement, capacity planning and other related purposes.

Figure 10B:
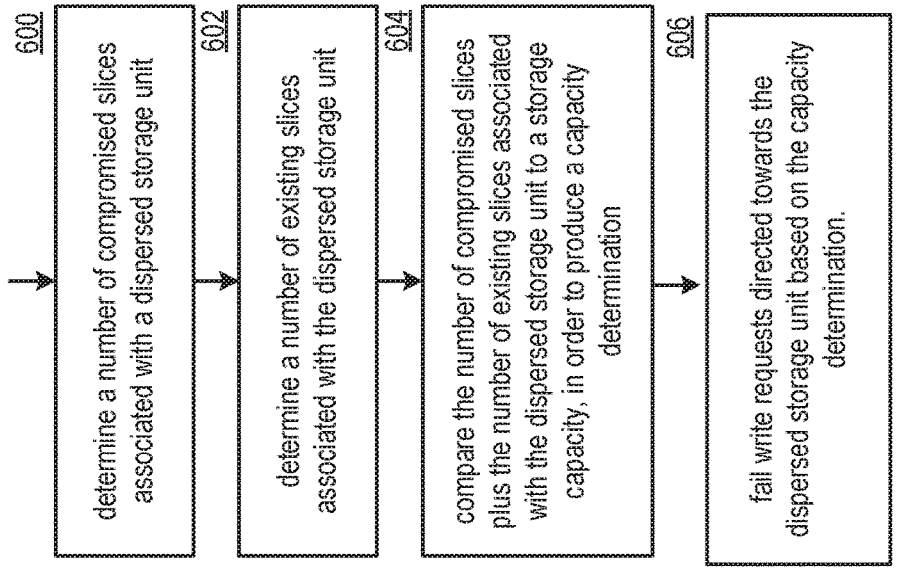
FIG. 10B is a flowchart illustrating an example of accounting for data whose rebuilding is deferred.

FIG. 10B is a flowchart illustrating an example of accounting for data whose rebuilding is deferred. The method includes a step 600 where a processing module 84 (e.g., of a distributed storage (DS) unit 36) determines a number of compromised slices associated with the DS unit.

The method continues at a step 602 where the processing module 84 determines a number of existing slices associated with the DS unit.

The method continues at a step 604 where the processing module 84 compares the number of compromised slices plus the number of existing slices associated with the dispersed storage unit to a storage capacity, in order to produce a capacity determination. Alternatively, in one example of operation a comparison of whether the number of compromised slices plus the number of existing slices associated with the dispersed storage unit exceeds a storage capacity is performed.

The method continues at the step 606 where the processing module may fail write requests directed towards the dispersed storage unit based on the capacity determination. For example, the processing module may fail write requests, when a write request would cause the dispersed storage unit to exceed the storage capacity of the dispersed storage unit taking into consideration existing slices as well as compromised slices that need to be rebuilt.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal A has a greater magnitude than signal B, a favorable comparison may be achieved when the magnitude of signal A is greater than that of signal B or when the magnitude of signal B is less than that of signal A. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from Figure to Figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information. A computer readable memory/storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method of managing data storage in a dispersed storage network, the dispersed storage network including a plurality of dispersed storage units, the method comprising:
   determining a number of compromised encoded data slices associated with a first dispersed storage unit of the plurality of dispersed storage units;
   determining a number of existing stored encoded data slices associated with the first dispersed storage unit of the plurality of dispersed storage units;
   comparing the number of compromised encoded data slices associated with the first dispersed storage unit of the plurality of dispersed storage units plus the number of existing stored encoded data slices associated with the first dispersed storage unit of the plurality of dispersed storage units to a storage capacity of the first dispersed storage unit of the plurality of dispersed storage units to produce a capacity determination, wherein the number of compromised encoded data slices reflects a number of corresponding deferred rebuilds; and
   failing write requests to the first dispersed storage unit of the plurality of dispersed storage units based on the capacity determination, and
   wherein a combination of the number of existing stored encoded data slices and the number of corresponding deferred rebuilds exceeds the capacity determination and the fail write requests prevents writing of additional encoded data slices beyond the capacity determination.

2. The method of claim 1, wherein compromised encoded data slices include one or more of bad slices and missing slices.

3. The method of claim 1, further comprising sending a report for receipt by a dispersed storage processing unit the report including the number of compromised encoded data slices associated with the first dispersed storage unit of the plurality of dispersed storage units.

4. The method of claim 3, wherein the report is used for quota enforcement.

5. The method of claim 3, wherein the report is used for storage location selection.

6. The method of claim 3, wherein the report is used for allotment enforcement.

7. The method of claim 3, wherein the report is used for capacity planning.

8. A dispersed storage unit for managing data storage in a dispersed storage network, the dispersed storage network including a plurality of dispersed storage units, the dispersed storage unit comprising:
   a memory; and
   a computer processor;
   where the memory includes instructions for causing the computer processor to:
   determine a number of compromised encoded data slices associated with a first dispersed storage unit of the plurality of dispersed storage units;
   determine a number of existing stored encoded data slices associated with the first dispersed storage unit of the plurality of dispersed storage units;
   compare the number of compromised encoded data slices associated with the first dispersed storage unit of the plurality of dispersed storage units plus the number of existing stored encoded data slices associated with the first dispersed storage unit of the plurality of dispersed storage units to a storage capacity of the first dispersed storage unit of the plurality of dispersed storage units to produce a capacity determination, wherein the number of compromised encoded data slices reflects a number of corresponding deferred rebuilds; and
   fail write requests to the first dispersed storage unit of the plurality of dispersed storage units based on the capacity determination, and
   wherein a combination of the number of existing stored encoded data slices and the number of corresponding deferred rebuilds exceeds the capacity determination and the fail write requests prevents writing of additional encoded data slices beyond the capacity determination.

9. The dispersed storage unit of claim 8, wherein compromised encoded data slices include one or more of bad slices and missing slices.

10. The dispersed storage unit of claim 8, wherein the memory includes instructions for further causing the computer processor to send a report for receipt by a dispersed storage processing unit the report including the number of compromised encoded data slices associated with the dispersed storage unit.

11. The dispersed storage unit of claim 10, wherein the report is used for quota enforcement.

12. The dispersed storage unit of claim 10, wherein the report is used for storage location selection.

13. The dispersed storage unit of claim 10, wherein the report is used for allotment enforcement.

14. The dispersed storage unit of claim 10, wherein the report is used for capacity planning.

15. A dispersed storage network comprising:
   a dispersed storage processing unit;
   a plurality of dispersed storage units;
   a first dispersed storage unit of the plurality of dispersed storage units including:
   a first memory; and
   a first computer processor;
   where the first memory includes instructions for causing the first computer processor to:
   determine a number of compromised encoded data slices associated with the first dispersed storage unit of the plurality of dispersed storage units;
   determine a number of existing stored encoded data slices associated with the first dispersed storage unit of the plurality of dispersed storage units;
   compare the number of compromised encoded data slices associated with the first dispersed storage unit of the plurality of dispersed storage units plus the number of existing stored encoded data slices associated with the first dispersed storage unit of the plurality of dispersed storage units to a storage capacity of the first dispersed storage unit of the plurality of dispersed storage units to produce a capacity determination, wherein the number of compromised encoded data slices reflects a number of corresponding deferred rebuilds; and fail write requests to the first dispersed storage unit of the plurality of dispersed storage units based on the capacity determination, and wherein a combination of the number of existing stored encoded data slices and the number of corresponding deferred rebuilds exceeds the capacity determination and the fail write requests prevents writing of additional encoded data slices beyond the capacity determination.

16. The dispersed storage network of claim 15, wherein compromised encoded data slices include one or more of bad slices and missing slices.

17. The dispersed storage network of claim 15, wherein the first memory includes instructions for further causing the first computer processor to send a report for receipt by the dispersed storage processing unit the report including the number of compromised encoded data slices associated with the dispersed storage unit.

18. The dispersed storage network of claim 17, wherein the dispersed storage processing unit includes:
   a second memory; and
   a second computer processor;
      wherein the second memory includes instructions for causing the second computer processor to use the report for quota enforcement.

19. The dispersed storage network of claim 17, wherein the dispersed storage processing unit includes:
   a second memory; and
   a second computer processor;
      wherein the second memory includes instructions for causing the second computer processor to use the report for storage location selection.

20. The dispersed storage network of claim 17, wherein the dispersed storage processing unit includes:
   a second memory; and
   a second computer processor;
      wherein the second memory includes instructions for causing the second computer processor to use the report for allotment enforcement.

* * * * *